United States Patent [19]

Yonezawa et al.

[11] 4,143,937
[45] Mar. 13, 1979

[54] PHASE SHIFTER FOR HOLOGRAM RECORDING

[75] Inventors: Susumu Yonezawa, Kodaira; Yasuhiro Torii, Hachioji; Haruo Ogiwara, Tokorozawa; Gisaku Nakamura, Mitaka, all of Japan

[73] Assignee: Nippon Telegraph and Telephone Public Corporation, Tokyo, Japan

[21] Appl. No.: 849,580

[22] Filed: Nov. 8, 1977

Related U.S. Application Data

[63] Continuation-in-part of Ser. No. 612,962, Sep. 12, 1975, abandoned.

[30] Foreign Application Priority Data

Sep. 14, 1974 [JP] Japan ............................ 49/105500
Oct. 16, 1974 [JP] Japan ............................ 49/118009

[51] Int. Cl.² .................. G03H 1/02; G03H 1/16; G02B 5/00
[52] U.S. Cl. .................. 350/3.82; 350/162 SF; 350/314
[58] Field of Search ............ 350/3, 5, 162 SF, 314, 350/3.82

[56] References Cited

U.S. PATENT DOCUMENTS

| 3,604,778 | 9/1971 | Burckhardt | 350/3.5 |
| 3,883,232 | 5/1975 | Tsunoda | 350/162 SF |
| 4,037,918 | 7/1977 | Kato | 350/162 SF |

OTHER PUBLICATIONS

Minami et al., Proceedings of the 1974 International Electro-Optics Conference, Mar. 1974, pp. 125–130.

*Primary Examiner*—Ronald J. Stern
*Attorney, Agent, or Firm*—Sughrue, Rothwell, Mion, Zinn and Macpeak

[57] ABSTRACT

A phase shifter for adding a deterministic phase to an original information to be recorded in hologram. The phase shifter consists of a number of unit cells arranged in a matrix. A set of the unit cells are provided which will cause a certain phase shift to a light passing through each kind of the unit cells so as to distribute the light irradiance of the original information more evenly over the Fourier transformed plane. The invention suggests a solution to make the phase shifter with the unit cells arranged by the deterministic phase distribution.

3 Claims, 22 Drawing Figures

L=13    Value of Ind (P)

| Primitive root r \ P | 1 | 2 | 3 | 4 | 5 | 6 | 7 | 8 | 9 | 10 | 11 | 12 |
|---|---|---|---|---|---|---|---|---|---|---|---|---|
| 2 | 0 | 1 | 4 | 2 | 9 | 5 | 11 | 3 | 8 | 10 | 7 | 6 |
| 6 | 0 | 5 | 8 | 10 | 9 | 1 | 7 | 3 | 4 | 2 | 11 | 6 |
| 7 | 0 | 11 | 8 | 10 | 3 | 7 | 1 | 9 | 4 | 2 | 5 | 6 |
| 11 | 0 | 7 | 4 | 2 | 3 | 11 | 5 | 9 | 8 | 10 | 1 | 6 |

L=11    Value of Ind (P)

| Primitive root r \ P | 1 | 2 | 3 | 4 | 5 | 6 | 7 | 8 | 9 | 10 |
|---|---|---|---|---|---|---|---|---|---|---|
| 2 | 0 | 1 | 8 | 2 | 4 | 9 | 7 | 3 | 6 | 5 |

FIG. 4

L=13, r=2, Phase of $x_L(P)$

| S\P | 1 | 2 | 3 | 4 | 5 | 6 | 7 | 8 | 9 | 10 | 11 | 12 |
|---|---|---|---|---|---|---|---|---|---|---|---|---|
| 6 | 0 | π | 0 | 0 | π | π | π | π | 0 | 0 | π | 0 |
| 4 | 0 | $\frac{2\pi}{3}$ | $\frac{2\pi}{3}$ | $\frac{4\pi}{3}$ | 0 | $\frac{4\pi}{3}$ | $\frac{4\pi}{3}$ | 0 | $\frac{4\pi}{3}$ | $\frac{2\pi}{3}$ | $\frac{2\pi}{3}$ | 0 |
| 3 | 0 | $\frac{\pi}{2}$ | 0 | π | $\frac{\pi}{2}$ | $\frac{3\pi}{2}$ | $\frac{3\pi}{2}$ | $\frac{3\pi}{2}$ | 0 | π | $\frac{3\pi}{2}$ | π |
| 2 | 0 | $\frac{\pi}{3}$ | $\frac{4\pi}{3}$ | $\frac{2\pi}{3}$ | $\frac{5\pi}{3}$ | $\frac{5\pi}{3}$ | $\frac{5\pi}{3}$ | $\frac{2\pi}{3}$ | $\frac{2\pi}{3}$ | $\frac{4\pi}{3}$ | $\frac{\pi}{3}$ | π |
| 1 | 0 | $\frac{\pi}{6}$ | $\frac{2\pi}{3}$ | $\frac{\pi}{3}$ | $\frac{3\pi}{2}$ | $\frac{11\pi}{6}$ | $\frac{11\pi}{6}$ | $\frac{\pi}{2}$ | $\frac{4\pi}{3}$ | $\frac{5\pi}{3}$ | $\frac{7\pi}{6}$ | π |

FIG. 5

L=11, r=2, Phase of $x_L(P)$

| S\P | 1 | 2 | 3 | 4 | 5 | 6 | 7 | 8 | 9 | 10 |
|---|---|---|---|---|---|---|---|---|---|---|
| 5 | 0 | π | 0 | 0 | 0 | π | π | π | 0 | π |

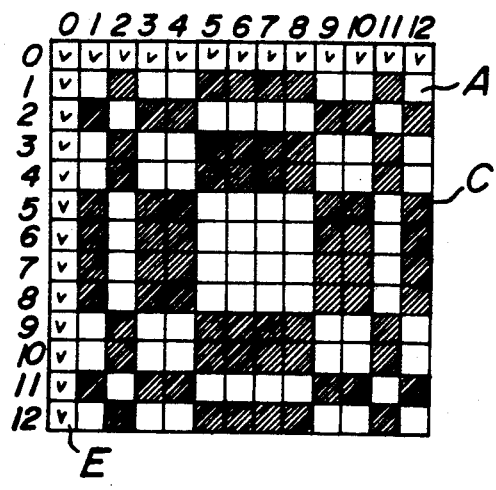
FIG_7a

FIG. 8
| N | φ | φ/π |
|---|---|---|
| 17 | 29° | 16% |
| 100 | 11.5° | 6.4% |
| 1000 | 3.6° | 2% |
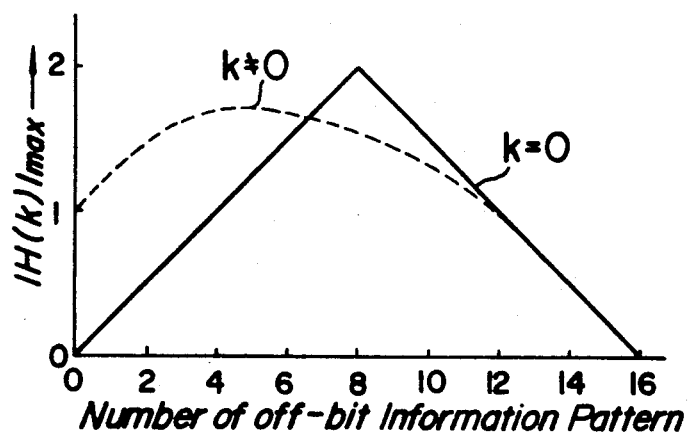
FIG. 9
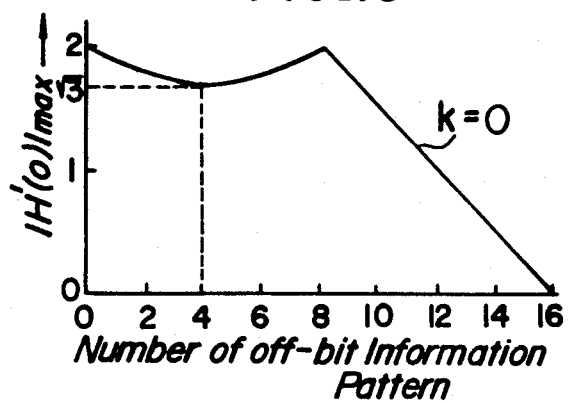
FIG. 10

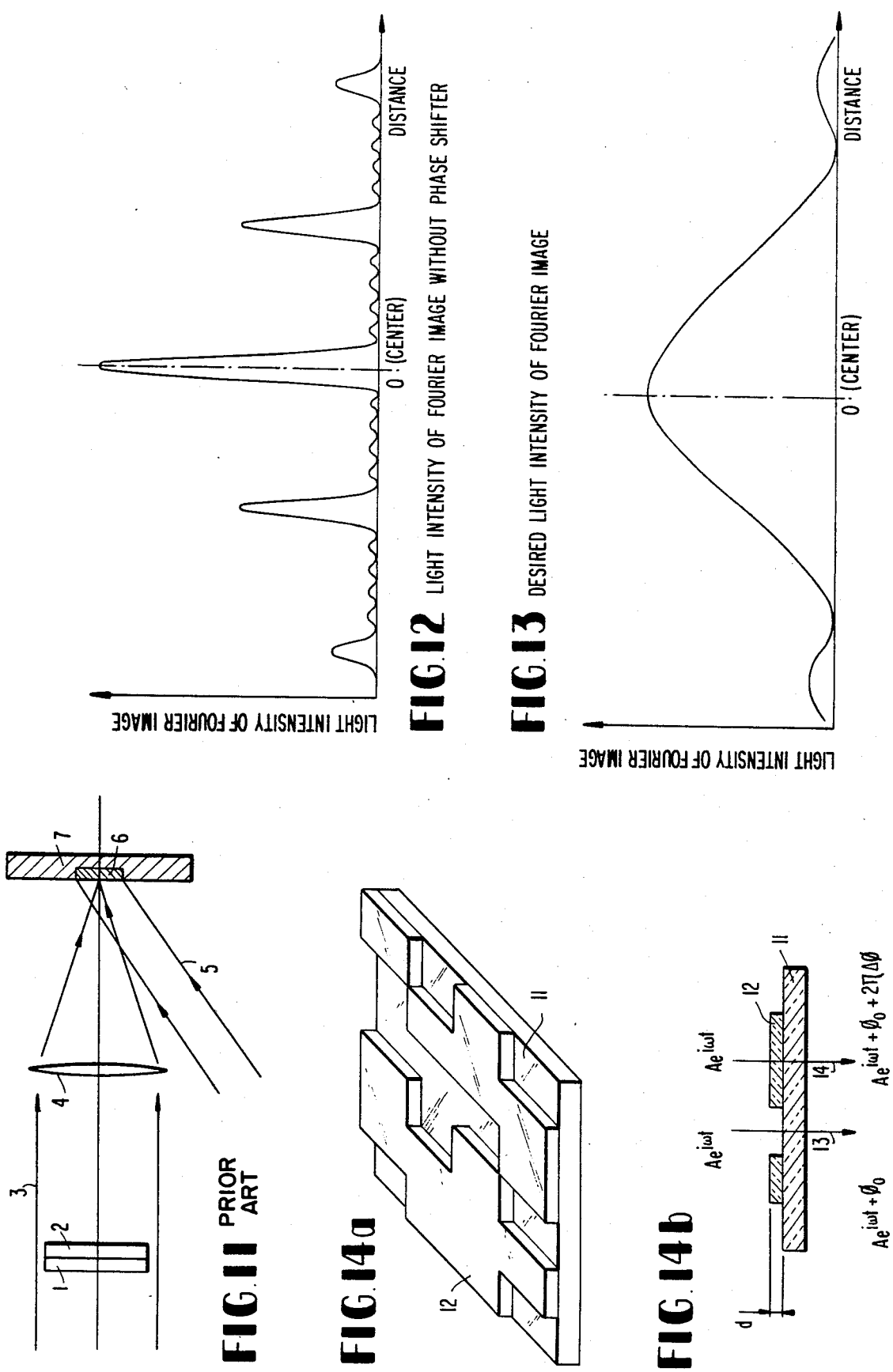

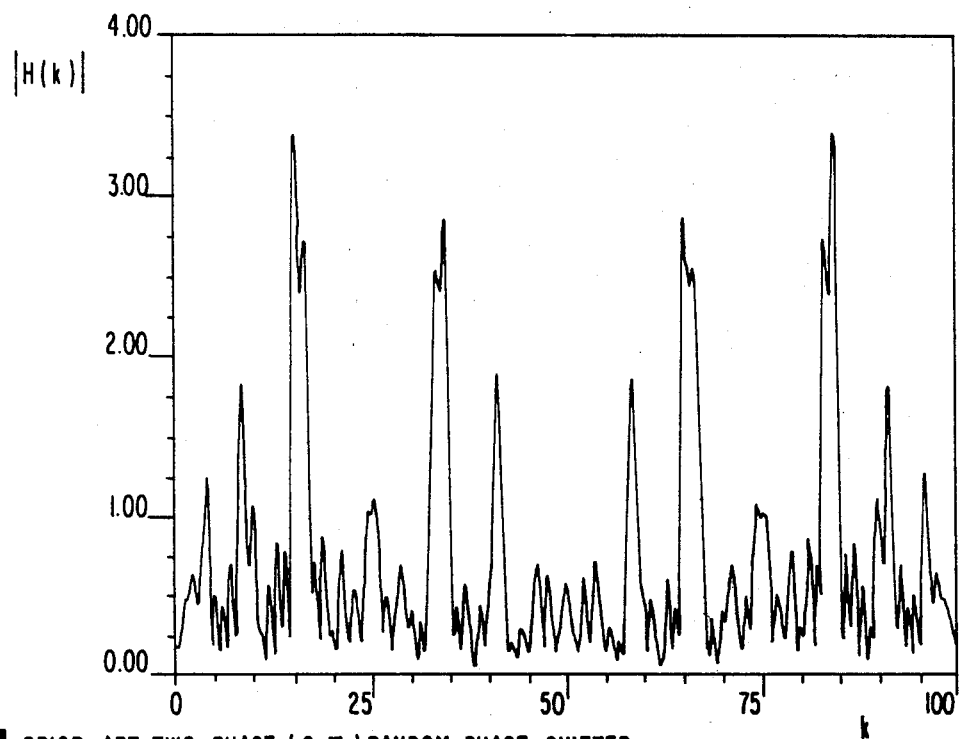
FIG.15a. PRIOR ART TWO-PHASE (0,π) RANDOM PHASE SHIFTER
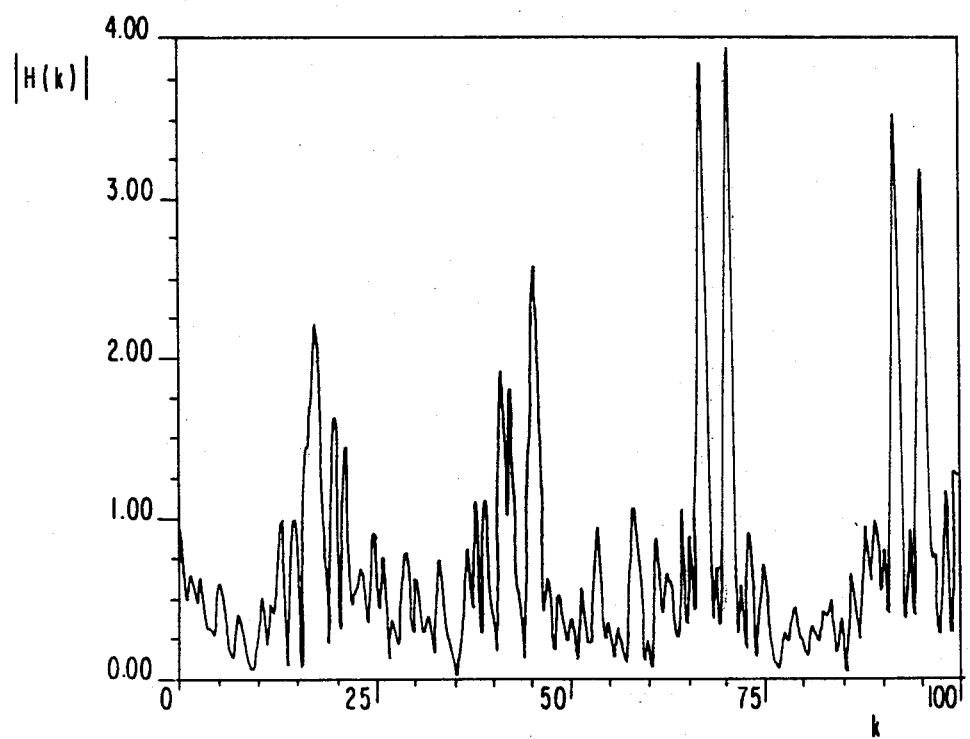
FIG.15b. PRIOR ART FOUR-PHASE (0,π/2,π,3/2π) RANDOM PHASE SHIFTER

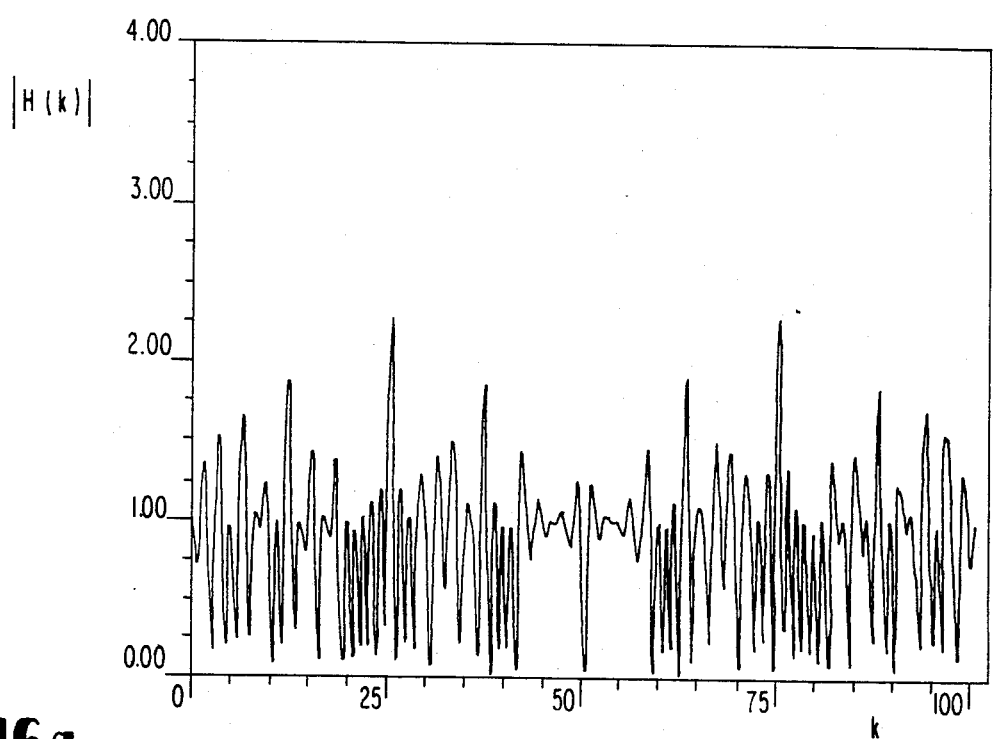
FIG. 16a. TWO-PHASE (0, π) PHASE SHIFTER
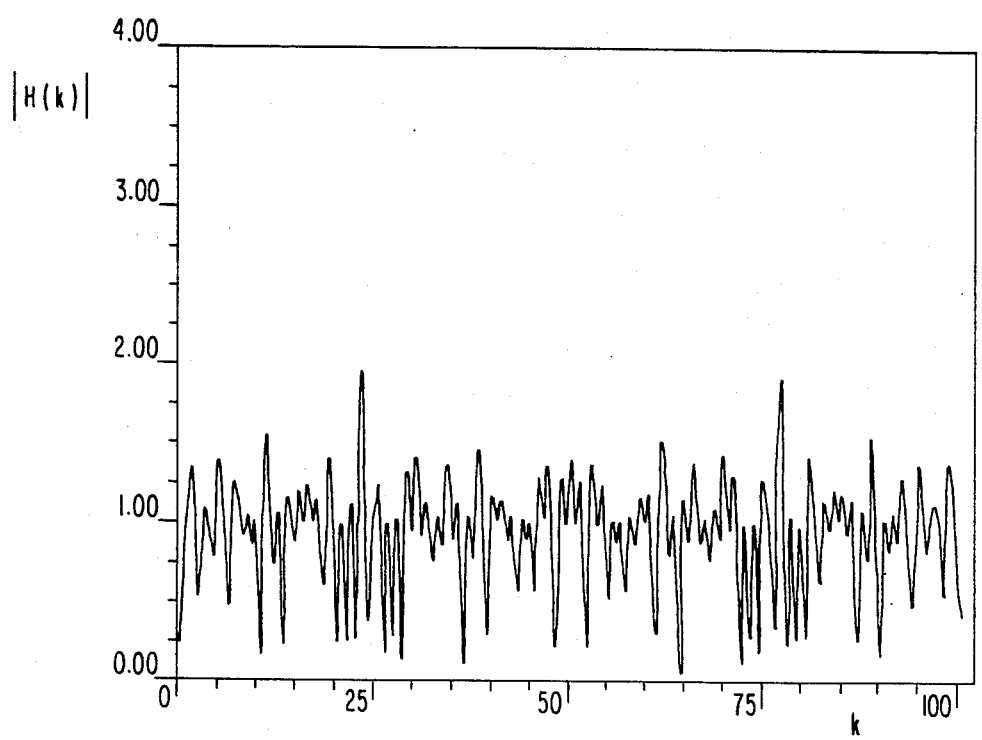
FIG. 16b. FOUR-PHASE (0, π/2, π, 3/2π) PHASE SHIFTER

PHASE SHIFTER FOR HOLOGRAM RECORDING

CROSS-REFERENCE TO RELATED APPLICATION

This application is a continuation-in-part of application Ser. No. 612,962 filed Sept. 12, 1975 now abandoned.

BACKGROUND OF THE INVENTION

1. Field of the Invention

The present invention relates to a phase shifter for adding deterministic phases to an original two dimensional information in order to make high quality and high storage density Fourier transformed holograms storing image information.

2. Description of the Prior Art

In recording a digital or an analog information on a photosensitive material by the holographic technique, it is common to use a Fourier transformed holography system, in which the hologram is recorded on the Fourier transformed plane in order to obtain high storage density. However, this Fourier transformed holography system has a disadvantage in that if the whole frequency components of the Fourier spectra of the original information should also be recorded precisely, saturation might occur in some bright portions of the Fourier spectra because of the non-linear characteristics of the photosensitive material used. Such saturation of the photosensitive material leads to a source of noise and results difficulties in obtaining a high diffraction efficiency of the hologram and thus a high quality reconstructed image is hardly realized.

In order to solve the abovementioned problem, the following two methods had been suggested:

(i) To shift the position of the photosensitive material at some distance from the exact Fourier transformed plane. This method is known as a defocus method.

(ii) To provide a phase shifter having spatial phase distribution with respect to the original two dimensional information so as to distribute the Fourier spectra more evenly over the Fourier transformed plane.

If the method (i) is introduced to solve the problem, distance between the exact Fourier transformed plane and the photosensitive material should be made much longer. This results in disadvantages of lowering the information density and in the lack of redundancy of the hologram in addition thereto.

On the other hand, the second method (ii) of providing the phase shifter has a considerable effect. Generally the phase shifter consists of a number of unit cells arranged in a matrix shape, and the unit cells are given two level $(0, \pi)$ or four level $(0, (1/2)\pi, \pi, 3/2\pi)$ phase shifts allotted at random. This random phase distribution is allotted by generating random numbers. Therefore, it is not decided deterministically so that a chosen distribution may not be guaranteed as a most suitable phase distribution.

Several methods of deterministic phase allocation for the unit cells forming such a phase shifter have been tried. A method of decision of such phase distribution in the case of providing a number of phase quantizations was reported already. However, if the number of the phase quantizations is increased, a disadvantage results in that the actual manufacture of the phase shifter becomes difficult.

SUMMARY OF THE INVENTION

The present invention is to solve the aforementioned problems in the provision of the phase shifter. The present invention is to realize a method of deterministic decision of the phase distribution for the unit cells forming the phase shifter to be used in conjunction with an original information being recorded in hologram. The present invention realizes an entirely different method from the conventional methods for the allocation of the phase distribution. The method of the invention may be applied for a wide range of the number of the phase quantizations from a small number of the phase levels up to a larger number thereof.

BRIEF DESCRIPTION OF THE DRAWINGS

FIG. 4 shows a practical embodiment of the phase term of primitive character $\chi_L(P)$ when the modulus is 13.

FIG. 5 shows another embodiment of the phase term of the primitive character $\chi_L(P)$ when the modulus is 11.

FIGS. 7-a, 7-b and 7-c show three practical embodiments of the level distribution of a phase shifter according to the present invention and having 13 rows and 13 columns.

FIG. 8 is a chart for showing values of the phase deviation $\phi$ from a perfect $0-\pi$ phase shift against the number N of the unit cells in a phase shifter of the present invention.

FIG. 9 shows maximum amplitude $|H(k)|$max of the discrete Fourier transform against the number of off-bits of the information pattern when the number N of the unit cells is 17 (N=17).

FIG. 10 shows maximum amplitude $|H'(0)|$max of the discrete Fourier transform against the number of off-bits of the information pattern.

FIG. 11 is a schematic diagram of a general arrangement for producing a Fourier transform hologram.

FIG. 12 is a graph showing the light intensity of a Fourier image without using the phase shifter of this invention.

FIG. 13 is a graph showing the desired light image of a Fourier image, which is the goal of this invention.

FIGS. 14a and 14b illustrate phase shifters and their general effect on light beams passing therethrough.

FIGS. 15a and 15b are graphs showing the non-uniform distribution obtained by prior art phase shifters.

FIGS. 16a and 16b show the more uniform distribution of light intensity obtained by the phase shifters of this invention.

DESCRIPTION OF THE PREFERRED EMBODIMENTS

The invention will now be described with reference to the accompanying drawings.

Figures 1, 2, 3:
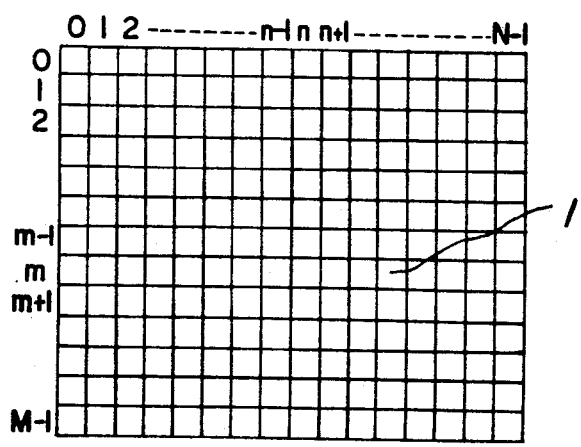
FIG. 1 shows basic arrangement of unit cells of a phase shifter made in accordance with the present invention.
FIG. 2 shows a practical embodiment of the indexes of Ind(P) when the primitive roots are 2, 6, 7, 11 and the modulus is 13.
FIG. 3 shows a practical embodiment of the indexes when the primitive root is 2 and the modulus is 11.

FIG. 1 shows an arrangement of the phase shifter according to the present invention which may provide phase changes by each of the unit cells for the two dimensional original information. As can be seen from FIG. 1, the phase shifter 1 is divided into matrix shaped unit cells having 1 or an odd prime number M in the vertical direction and 1 or an odd prime number N in the lateral direction. Each unit cell thus sub-divided will give a desired phase change to the light passing therethrough. The complex amplitude transmission of the unit cell located at mth row and nth column of the phase shifter, wherein m=0, 1, 2, ..., M-1; n=0, 1, 2, ..., N-1, is expressed by G(m, n). The phase shifter will cause only the spatial phase change without causing variation of the magnitude of the light amplitude, so that the following relation exists:

$$|G(m,n)| = 1 \tag{1}$$

Under such assumption, the wavefront distribution at the sampling point (j, k) (j, k: integer) in the Fourier transformed plane of the phase shifter is described by H(j, k) of a discrete Fourier transform of G(m, n) and is given by the following:

$$H(j,k) = M^{-1} N^{-1} \sum_{m=0}^{M-1} \sum_{n=0}^{N-1} G(m,n) \exp\{-i2\pi(mj/M + nk/N)\} \tag{2}$$

The essential feature of the present invention lies in that to decide the distribution of phase change for each of the unit cells of the phase shifter, namely to decide G(m, n), in a manner that the phase shifter satisfies the following condition (3) for the substantial number of j(j=0, 1, 2, ..., M-1), k(k=0, 1, 2, ..., N-1) in order to distribute the Fourier spectra more evenly over the Fourier transformed plane:

$$|H(j,k)| \simeq 1 \tag{3}$$

In accordance with the present invention, the complex amplitude transmission G(m, n) of the unit cell (m, n) is decided by the following equations (4):

$$\begin{aligned}
G(m,n) &= G_M(m)G_N(n) \\
m &= 0, 1, 2, \ldots, M-1, \\
n &= 0, 1, 2, \ldots, N-1, \\
G_M(m) &= \begin{cases} G_M(a) & \text{(in case of } m=a\text{)} \\ \chi_M(m-a) & \text{(in case of } m \neq a\text{)} \end{cases} \\
G_N(n) &= \begin{cases} G_N(b) & \text{(in case of } n=b\text{)} \\ \chi_N(n-b) & \text{(in case of } n \neq b\text{)} \end{cases}
\end{aligned} \tag{4}$$

wherein:
M, N are 1 or odd prime numbers,
a is a certain definite integer among 0, 1, 2, ..., M-1,
b is a certain definite integer among 0, 1, 2, ..., N-1,
$\chi_L(P)$ is a primitive character when the modulus is L, $$\chi_L(P) = \exp\{i2\pi \frac{S}{L-1} \text{Ind}(P)\},$$

wherein S is a certain definite integer among 1, 2, ..., L-2, and Ind(P) is an index making a primitive root having modulus L as the base.

$$|G_M(a)| = 1 \text{ or } 0$$

$$|G_N(b)| = 1 \text{ or } 0$$

The primitive character $\chi_L(P)$ having its modulus L will be explained briefly for the items related with the present invention.

When P is an arbitrary integer which is not exactly divisible by L (L: odd prime number) and having r as a primitive root, and when the following relation (5) exists:

$$P \equiv r^{\text{Ind}(P)} \pmod{L} \tag{5}$$

Ind(P) is termed as an index of P having r as the base.

If we assume $\rho$ is the (L-1) root of $-1$, and if the following relation (6) exists, $\chi_L(P)$ is termed as a primitive character relating to modulus L:

$$\chi_L(P) = \rho^{\text{Ind}(P)} \tag{6}$$

If we assume the following equation (7) for an odd prime number L, the character $\chi_L(P)$ obtained by introducing equation (7) into equation (6) becomes as a primitive character:

$$\rho = \exp\{i2\pi S/(L-1)\} \tag{7}$$

$$S = 1, 2, \ldots, L-2$$

Namely, the primitive character $\chi_L(P)$ becomes $$\chi_L(P) = \exp\{i2\pi \frac{S}{L-1} \text{Ind}(P)\} \tag{7'}$$

$$S = 1, 2, \ldots, L-2,$$

We may consider the following summation:

$$K_L(l) = \sum_{P=1}^{L-1} \chi_L(P) e^{-2\pi i l P/L} \tag{8}$$

{l: integer other than $l \equiv 0 \pmod{L}$}

This sum is equivalent to that known as the Gaussian sum in the theory of numbers. In this sum, P may be any of the remainders having L as moduli. When $\chi_L(P)$ is a primitive character, generally the following relation (9) is established for the equation (8):

$$|K_L(l)| = L^{1/2} \tag{9}$$

The equation (9) is proved briefly as follows:

$$K_L(l) = \sum_{p=1}^{L-1} \chi_L(P) e^{-2\pi i l p/L}$$

$$= \chi_L^*(l) \sum_{p=1}^{L-1} \chi_L(lP) e^{-2\pi i l p/L}$$

{wherein, mark * is the conjugate code. Namely:

$$\chi_L(P)\chi_L^*(P) = 1,$$

and the relation of $\chi_L(lP) = \chi_L(l)\chi_L(P)$ exists, which is derived from
Ind(l) + Ind(P) = Ind(lP) and equation (6)}.
Furthermore as the following relation establishes:

$$\sum_{p=1}^{L-1} \chi_L(lP) e^{-2\pi i l P/L} = K_L(1)$$

Accordingly:

$$K_L(l) = \chi_L(l) K_L(1) \quad (10)$$

Therefore, from equation (10):

$$\sum_{l=1}^{L-1} |K_L(l)|^2 = |K_L(1)|^2 \sum_{l=1}^{L-1} |\chi_L(l)|^2 \quad (11)$$

On the other hand, the following relation exists:

$$\sum_{l=1}^{L-1} |K_L(l)|^2 = \sum_{r=1}^{L-1} \sum_{s=1}^{L-1} \chi_L(r) \chi^*_L(s) \sum_{l=1}^{L-1} e^{-2\pi i (r-s)l/L} \quad (12)$$

$$= \sum_{r=1}^{L-1} \sum_{s=1}^{L-1} \chi_L(r) \chi^*_L(S) \cdot (\sum_{l=1}^{L} e^{-2\pi i(r-s)l/L} - 1)$$

$$= L \sum_{r=1}^{L-1} \sum_{s=1}^{L-1} \chi_L(r) \chi^*_L(S) \delta_{r,s} - |\sum_{r=1}^{L-1} \chi_L(r)|^2$$

(wherein, $\delta_{r,s}$ is Kronecker's symbol)

namely $\delta_{r,s} = \begin{cases} 1 \text{ if } r = s \\ 0 \text{ otherwise} \end{cases}$ Further from equations (6) and (7) the following relation (13) is established:

$$\sum_{r=1}^{L-1} \chi_L(r) = \sum_{r=1}^{L-1} \exp\{i2\pi S \cdot \text{Ind}(r)/(L-1)\} \quad (13)$$

On the other hand, Ind(r) has a value of 0, 1, 2, 3, ..., L-2 without any duplication against r = 1, 2, 3, ..., L-1, therefore, the equation (13) becomes as follows:

$$\sum_{r=1}^{L-1} \chi_L(r) = \sum_{r'=0}^{L-2} \exp\{i2\pi Sr'/(L-1)\} = (L-1)\delta_{s,o} \quad (14)$$

Namely, for $S = 1, 2, 3, \ldots, L-2$, the following is established:

$$\sum_{r=1}^{L-1} \chi_L(r) = 0 \quad (15)$$

Accordingly, from equations (12) and (15), the following relation (16) is established:

$$\sum_{l=1}^{L-1} |K_L(l)|^2 = L \sum_{r=1}^{L-1} |\chi_L(r)|^2 \quad (16)$$

By the comparison of the right hand sides of the equations (11) and (16), we obtain the following:

$$|K_L(1)| = L^{1/2} \quad (17)$$

Accordingly, the establishment of the equation (9) has been proved from the equations (6), (7), (10) and (17).

Besides, $K_L(l)$ for $l \equiv 0 \pmod{L}$ is given by the following as corresponding to equation (8):

$$K_L(O) = \sum_{P=1}^{L-1} \chi_L(P)$$

From equation (14), the following may be obtained:

$$K_L(O) = (L-1)\delta_{s,o} \quad (18)$$

Now, the phase arrangement G(m, n) for each unit cell of the phase shifter according to the present invention which is given by the equation (4) is proved as to satisfy the equation (1) by using the equations (6) and (7). It will be explained hereinafter the same arrangement satisfies also the equation (3). By inserting the equation (4) into the equation (2), and introducing, $m' = M + m - a$, ($m = 0, 1, 2, \ldots, a-1$),
$m' = m - a$, ($m = a+1, a+2, \ldots, M-1$),
$n' = M + n - b$, ($n = 0, 1, 2, \ldots, b-1$),
$n' = n - b$, ($n = b+1, b+2, \ldots, N-1$)

and further considering the fact that j, k are integers and by taking the equations (5) and (6), the following equation (19) will be obtained straight-forwardly:

$$H(j,k) = M^{-\frac{1}{2}} N^{-\frac{1}{2}} \exp(-i2\pi j a/M) \exp(-i2\pi k b/N) \quad (19)$$

$$\cdot [G_M(a) + \sum_{m'=1}^{M-1} \chi_M(m') \exp(-i2\pi j m'/M)]$$

$$\cdot [G_N(b) + \sum_{n'=1}^{N-1} \chi_N(n') \exp(-i2\pi k n'/N)]$$

By using the symbols used in the equation (8), we obtain:

$$|H(j,k)| = M^{-\frac{1}{2}} N^{-\frac{1}{2}} \{G_M(a) + K_M(j)\} \cdot \{G_N(b) + K_N(k)\} \quad (20)$$

The equation (20) is rewritten by using $|G_M(a)| = |G_N(b)| = 1$ and equations (9) and (15) and by assuming $M^{1/2}, N^{1/2} \gg 1$ as follows:

$$|H(O,O)| = M^{-\frac{1}{2}} N^{-\frac{1}{2}}, \quad |H(j,k)| \simeq 1,$$

$$\{\text{not } j \equiv 0(\text{mod}.M), \text{ nor } k \equiv 0(\text{mod}.N)\}$$

Accordingly, except the portion of $j \equiv 0(\text{mod}.M)$, or $k \equiv 0(\text{mod}.N)$, it can be said that the condition of the equation (3) is satisfied. The rate of the portions where the equation (3) is not satisfied can be considered as substantially negligible and in an order of $(M+N-1)/MN = 1/M + 1/N - 1/MN.$ More especially, in the case of $G_M(a) = G_N(b) = 0$ (the unit cell in the phase shifter located at ath row and bth column does not pass the light), the following relation exists for any odd prime numbers from equations (20) and (9) for the portions except $j \equiv 0 \pmod{M}$ and $k \equiv 0 \pmod{N}$:

$$|H(j,k)| = 1,$$

and as same as explained in the foregoing, the uniformity of the Fourier spectra has been obtained in the substantial portion of the Fourier transformed plane. In this case, the values of a and b may be decided to meet the original information to be recorded, but in general the following selection will give a particularly suitable results:

$a = 0$ or $a = M-1$, and $b = 0$ or $b = N-1$.

As has been described in the foregoing, by deciding the phase distribution for each of the unit cells forming the phase shifter of the present invention so as to satisfy the equation (4), the uniformity of the Fourier spectra is realized. The number of quantized phase levels of the unit cells forming the phase shifter becomes as follows from the equations (4), (6) and (7) for the portions except m=a or n=b:

$$G(m, n) = \exp\{i2\pi u \cdot \text{Ind}(m-a)/M-1\} \cdot \exp\{i2\pi v \cdot \text{Ind}(n-b)/N-1\} \quad (21)$$

$$u = 1, 2, \ldots, M-2$$
$$v = 1, 2, \ldots, N-2$$

so that it is possible to select the number as the same as the least common multiple of divisor of M-1 except 1 and divisor of N-1 except 1.

Practical embodiments of the phase shifter of the present invention will be described hereinafter.

When an odd prime number L is given in the equation (5), in general, there are $\psi(L-1)$ number of primitive roots corresponding thereto. $\psi(m)$ is Euler's function in the theory of numbers, and when making prime factors of m are p, q, r, ..., it is given by the following:

$$\psi(m) = m(1 - \frac{1}{p})(1 - \frac{1}{q})(1 - \frac{1}{r}) \quad (22)$$

When we select L=13, then $m=13-1=12=2^2 \cdot 3$ so that $$\psi(12) = 12(1 - \frac{1}{2})(1 - \frac{1}{3}) = 4$$

and there are 4 primitive roots. In fact, there are 4 primitive roots r of mod. 13 and these are 2, 6, 7, 11. With respect to the equation (5) and in deciding the index of Ind(P), any one of 2, 6, 7, 11 (mod. 13) can be selected as the primitive root, and the practical values are shown in FIG. 2 for the case of the primitive roots 2, 6, 7, and 11. In the same manner, values of Ind(P) are shown in FIG. 3 in the case of the primitive root r of mod.11 is 2 in the equation (5). In this case, the primitive character given by the equations (6) and (7) is decided by the selection of the number S.

FIG. 4 shows the value of the phase term of the primitive character $\chi_L(P)$ for S=6, 4, 3, 2, 1 in the case of L=13 and r=2. The numbers of the quantized phase level are 2, 3, 4, 6, 12, respectively. In the same manner, FIG. 5 shows value of phase term for the primitive character $\chi_L(P)$ in the case of L=13, r=2, S=5.

Figure 6A:
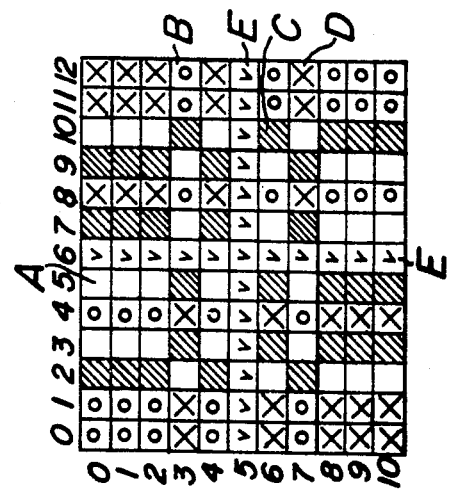
FIGS. 6-a and 6-b show two practical embodiments of distribution of four phase level of a phase shifter having 11 rows and 13 columns.
Figure 6B:
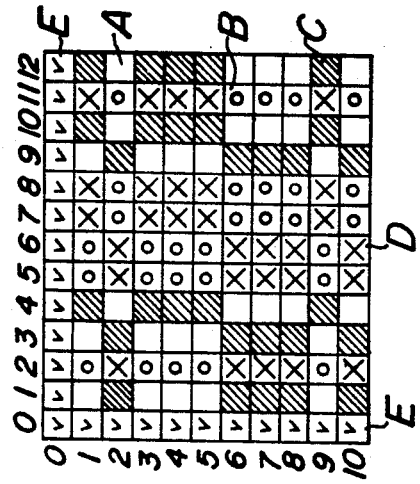

FIGS. 6-a and 6-b show two practical embodiments of phase distribution of the phase shifter made in accordance with the present invention having factors of M=11 and N=13. The distribution of the phase changes has been decided in accordance with the equation (4). The above embodiments correspond to the case of the primitive character $\chi_{11}(P)$ as shown in FIG. 5 having values of r=2, S=5 in the equations of (5) and (6) and of $\chi_{13}(P)$ as shown in FIG. 4 having values of r=2, S=3. FIG. 6-a is the case of a=0, b=0 in the equation (4), and FIG. 6-b is the case of a=5, b=6 in the same equation (4).

In the FIGS. 6-a and 6-b, the unit cells designated by A are the unit cells having phase 0, B of phase $(1/2)\pi$, C of $\pi$, D of $(3/2)\pi$. The unit cells designated by E are those in ath row and in bth column. The distribution of the phase changes for the cells in the ath row and in the bth column may be decided by arbitrarily selecting $|G_M(a)|=1$ or 0, $|G_N(b)|=1$ or 0 in the same manner with the equation (4).

Figures 7B, 7C:
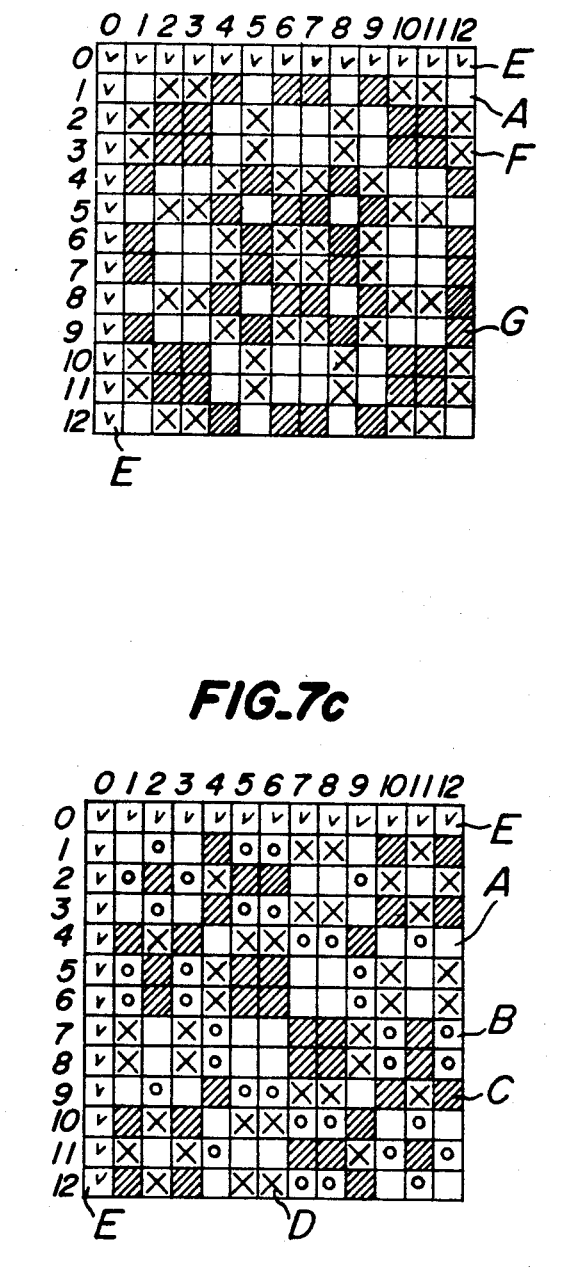

FIGS. 7-a, 7-b and 7-c show three embodiments of the phase distribution according to the present invention for the phase shifter having factors M=N=13, and a=b=0.

FIG. 7-a is the case of character $\chi_{13}(P)$ and r=2, S=6 in the equations (5) and (6).

FIG. 7-b is the case of r=2, S=4 and FIG. 7-c is the case of r=2, S=3 under the same equations. The phase levels are 2, 3 and 4, respectively.

In the FIGS. 7-a, 7-b and 7-c, A designates unit cells having phase of 0, F designates unit cells having phase of $(2/3)\pi$, G designates unit cells having $(4/3)\pi$, B designates unit cells having phase of $(1/2)\pi$, C designates unit cells having phase of $\pi$, D designates unit cells having phase of $(3/2)\pi$, E designates unit cells in a(=0)th row and b(=0)th column. The phase distribution for the unit cells in 0th row and 0th column may arbitrarily be decided by allotting $|G_M(0)|=1$ or 0, $|G_N(0)|=1$ or 0 in the same manner of equation (4).

In the embodiments shown in FIGS. 6-a, 6-b and 7-a to 7-c of the present invention, some particular values of the primitive roots have been recited, however, the phase distribution may be decided in the same manner by using other primitive roots.

Furthermore, in the foregoing explanation the invention had been referred by using a two-dimensional phase shifter. However, the invention may equally be applied in the case of one dimensional phase shifter by deciding the phase distribution by introducing $G(n)=G_N(n)$ in the equation (4).

The nature of the phase shifter according to the present invention will be explained hereinafter by taking an example of a two level (0, $\pi$) phase shifter. In order to simplify the explanation, a one dimensional phase shifter will be explained. The phase distribution $G_N(n)$ of the two level one dimensional phase shifter of the present invention will be given by placing $S=(N-1)/2$ in the equations (4), (6) and (7). More especially, it is given by the following in case of a=0, $G_N(0)=0$:

$$G_N(n) = \begin{cases} 0 & (n = 0) \\ \chi_N(n) = (-1)^{\text{Ind}(n)} & (n = 1, 2, \ldots, N-1) \end{cases} \quad (23)$$

when we place H(k) for a one dimensional discrete Fourier transform of the equation (23), we obtain the following:

$$H(k) = \frac{1}{\sqrt{N}} \sum_{n=1}^{N-1} \chi_N(n) e^{-i2\pi kn/N} \quad (24)$$

By introducing the Gaussian sum used in the equation (8) it becomes as follows:

$$H(k) = \frac{1}{\sqrt{N}} \cdot K_N(k) \quad (25)$$

Accordingly, the following relation is given from the equations (9) and (18):

$$|H(k)| = \begin{cases} 1 & \text{(in case of } k \not\equiv 0 \ (\text{mod}.N)) \\ 0 & \text{(in case of } k \equiv 0 \ (\text{mod}.N)) \end{cases} \quad (26)$$

If we assume that a phase change $(\pi+\phi)$ is given for the unit cell to cause a phase change $\pi$, the phase distribution $G_N(n)$ of the phase shifter becomes as follows:

$$G_N(n) = \begin{pmatrix} 1 & \{\text{in case of } \chi_N(n) = 1\} \\ -e^{i\phi} & \{\text{in case of } \chi_N(n) = -1\} \end{pmatrix} \quad (27)$$

The above equation may be rewritten as follows:

$$G_N(n) = \frac{1}{2}\{(\chi_N(n) + 1) + (\chi_N(n) - 1)e^{i\phi}\} = \quad (28)$$
$$\frac{1}{2}(1 + e^{i\phi})\chi_N(n) + \frac{1}{2}(1 - e^{i\phi})$$

The one dimensional discrete Fourier transform $H'(k)$ of the equation (28) becomes as follows:

$$H'(k) = \frac{1}{2}(1 + e^{i\phi})\frac{1}{\sqrt{N}}\sum_{n=1}^{N-1}\chi_N(n)e^{-i2\pi nk/N} + \quad (29)$$
$$\frac{1}{2}(1 - e^{i\phi})\frac{1}{\sqrt{N}}\sum_{n=1}^{N-1}e^{-i2\pi nk/N}$$

Accordingly, from equation (24) it will give the following:

$$H'(k) = \frac{1}{2}(1 + e^{i\phi})H(k) + \quad (30)$$
$$\frac{1}{2}(1 - e^{i\phi})\frac{1}{\sqrt{N}}\sum_{n=1}^{N-1}e^{-i2\pi nk/N}$$

We assume $N >> 1$ and using the equation (26) and the following relation (31):

$$\sum_{n=1}^{N-1}e^{-i2\pi nk/N} = N\delta_{k,o} - 1 \quad (31)$$

we obtain the following:

$$|H'(k)| \begin{cases} \approx \frac{1}{2}|(1 + e^{i\phi})| = |\cos\frac{\phi}{2}|, & \{k \not\equiv 0 \ (\text{mod}.N)\} & (32) \\ = \frac{1}{2}\frac{N-1}{\sqrt{N}}|(1 - e^{i\phi})| \approx \sqrt{N}|\sin\frac{\phi}{2}|, & \{k \equiv 0 \ (\text{mod}.N)\} & (33) \end{cases}$$

From the equation (32), it can be understood that the amplitude of the discrete Fourier transform becomes uniform at the position of $K \neq 0$ (mod.N) even in case the phase difference is $\pi+\phi$. Further from the equations (32) and (33), it can be understood that $|H'(k)|$ $\{k \neq 0 \ (\text{mod}.N)\}$ becomes smaller according to an increase of the absolute value of $\phi$ but the value $|H'(0)|$ increases in the corresponding amount.

The condition of $|H'(0)|=|H'(k)|$ is given by the equations (32) and (33) and is as follows:

$$|\tan\frac{\phi}{2}| = \frac{1}{\sqrt{N}} \quad (34)$$

The values of $\phi$ satisfying the above equation (34) are shown with respect to the number N of the unit cells of the phase shifter in the table of FIG. 8.

When the information pattern is other than all-1 bits, wherein all the patterns have the value 1, we must make consideration for the maximum value $|H(k)|$max of the amplitude of the discrete Fourier transform among the all information pattern. The maximum value $|H(k)|$max of the amplitude of the discrete Fourier transform occurs at the position of $k=0$ when the respective information patterns only for the unit cells having value of $\chi(n)=1$ (or $\chi(n)=-1$) have value 1 so as to pass the light. In this case, $|H(0)|$max becomes $(N-1)/2\sqrt{N}$.

FIG. 9 shows the maximum value $|H(k)|$max of the amplitude $|H(k)|$ of the Fourier transform against the number of off-bit unit cells of the information pattern which interrupt the light in case the number N of unit cells of two level phase shifter is 17(N=17).

For the phase difference of $(\pi+\phi)$, the maximum value of the amplitude $|H'(k)|$max of the discrete Fourier transform at the position of $k=0$ can be obtained from an isosceles triangular shape having the length of isosceles branches of $(N-1)/2$ and the vertical angle $\phi$. When $\phi=\pm 60°$, the amplitude $|H'(0)|$max for the all-1 bits information pattern becomes equal to the maximum amplitude $(N-1)/2\sqrt{N}$ of the time of $\phi=0$. The distribution of the maximum amplitude of $|H'(0)|$max is shown in FIG. 10.

FIG. 10 shows the maximum value $|H'(0)|$max of the Fourier transform of the phase shifter of the present invention having $\phi=\pm 60°$ against number of the off-bits of the information pattern. The equalization of the amplitude $|H'(k)|$ of the all-1 bits of information pattern at the position of $k \neq 0$ has been guaranteed from the equation (32) even when the phase difference $\phi$ is $\pm 60°$ ($\phi=\pm 60°$) so that the condition to be used as the phase shifter has been retained.

The above description may be expanded to include the application of a two level phase shifter among the phase shifters of the present invention, and this permits widening the condition for the design of the phase shifter and increasing the permissible manufacturing tolerance. More particularly, it shows the fact that the magnitude of the amplitude can be made equal for any number of k by providing the phase shifter to satisfy the condition given by the equation (34).

In the foregoing explanation, it has been assumed that $a=0$, $G_N(0)=0$, however, the above relation is established also in a case of $a \neq 0$, and further, it is established in the case of $G_N(0) \neq 0$ when $N >> 1$.

For manufacturing the phase shifter of the present invention, a metal mask having holes at locations corresponding to the desired phase distribution is used to cover a transparent plate and an optically transparent material, for instance a transparent dielectric film, may be applied thereon by one or more vaporization processes.

The amount of phase shift $\phi(m, j)$ of the unit cell of the phase shifter at the mth row and nth column is given by the equations (4) and (7'), for $m \neq a$ and $n \neq b$ as follows.

$$G(m, n) = \quad (35)$$
$$\exp\{i2\pi\frac{u}{M-1}\text{Ind}(m - a)\} \cdot \exp\{i2\pi\frac{v}{N-1}\text{Ind}(n - b)\} =$$
$$\exp i2\pi\{\frac{u}{M-1}\text{Ind}(m - a) + \frac{v}{N-1}\text{Ind}(n - b)\}$$

wherein u is a certain definite integer among 1, 2, ..., M-2,
v is a certain definite integer among 1, 2, ..., N-2,
Therefore, it is given that:

$$\phi(m, n) = 2\pi\{\frac{u}{M-1} \text{Ind}(m-a) + \frac{v}{N-1} \text{Ind}(n-b)\} \pmod{2\pi} \quad (36)$$

Accordingly, film thickness of d(m, n) of a transparent dielectric film at mth row and nth column is given by $$d(m, n) = \frac{\lambda}{(\epsilon - 1)} \frac{\phi}{2\pi} \quad (37)$$

wherein:
λ is the wavelength of the utilized laser light, and
ε is the index of refraction of the utilized transparent dielectric film.

Accordingly, the film thickness d(m, n) as is given by the equation (37) should be realized at the unit cell located at (m, n).

The unit cells at row of m = a and column of n = b may be made opaque so as not to pass the light or be made at arbitrary phase difference according to equation (4).

In practice it is convenient to select this phase shift as an integral number multiple of the minimum phase shift amount of the phase shifter for the manufacture, the film thickness of the phase shifter at the ath row or bth column is given by:

$$\left.\begin{array}{c} d(a, n) \\ d(m, b) \end{array}\right\} = \frac{\lambda}{\epsilon - 1} \{\frac{a'}{M-1} + \frac{b'}{N-1}\} \quad (38)$$

wherein, a', b' are integrals freely selected from the groups of 0, 1, 2, ..., M-2 and 0, 1, 2, ..., N-1, respectively, for a certain value of m and n.

In the foregoing explanation, the shape of the unit cell for providing the phase distribution on the phase shifter is considered to be a regular square shape. But it is apparent that this regular square form is not limiting the present invention and other symmetric forms such as rectangular or circular form may be used.

The invention has been explained for the case of providing an optical hologram, however, the method of the present invention for deciding the phase distribution of the phase shifter may effectively be used for the method of coding the phases of the input information to be recorded as a computer-generated hologram.

The phase shifter of the present invention for recording the hologram may be used as a phase shifter for adding phase change to an original information to be recorded in a hologram has a deterministic phase distribution. It can afford advantages of recording Fourier transform holograms with high diffraction efficiency and high quality since the distribution of the Fourier spectra of the original information is spread over the Fourier transformed plane, i.e., the hologram plane.

The phase shifter according to the present invention may quite effectively be applied in case of providing file memories by holographic recording for image information such as a video package system or holographic image retrieval system or an optical memory for recording a digital information.

FIGS. 11-16 are presented in further explanation of the foregoing invention.

FIG. 11 shows a general arrangement for producing a Fourier transform hologram. In this arrangement, an information bearing element 2, such as a page composer or information pattern, is arranged in superposition with a phase shifter or phase shifting plate 1 and is read by a laser beam 3 through a lens 4. The Fourier transform image of the readout pattern and a reference light beam 5 interfere with each other. The obtained interference pattern or hologram 6 is recorded on a photosensitive recording medium 7.

A most important matter in the production of such a Fourier transform hologram is to produce a large light strength distribution locally at the Fourier transform image on the surface of the photosensitive medium 7.

If the phase shifter 1 is not used, the light intensity distribution of the Fourier image will have a shape, for instance, as shown in FIG. 12. As shown in FIG. 12, the distribution includes several strong light spikes. More specifically, the light may be concentrated on the light axis illustrated by center point 0.

Such a Fourier transform image is difficult to record linearly on the photosensitive medium. Therefore, a more uniform light distribution of the Fourier image, such as shown in FIG. 13, is a desired object.

For this object, normally a phase shifter modulating only the phase of the light had been used. FIGS. 14a and 14b show schematically such a phase shifter; FIG. 14a is an extremely enlarged view showing the shpae thereof, and FIG. 14b is a cross-section of the same.

The phase shifter has a transparent base 11, generally made of glass, and a transparent film 12, having refractive index n and thickness d, deposited on the base by vaporization.

The portion carrying the transparent thin film 12 shifts the phase by $\epsilon\phi = d(n-1)/\lambda$, wherein λ is the wavelength of the light beam 14. Light beam 13 does not pass through the film 12.

In order to obtain more or less uniform light distribution, as shown in FIG. 13, it is very important that the correct portion of the transparent base 11 be covered by the transparent thin film 12.

It has been proved theoretically that discrete Fourier transform H(j, k) of G(m, n) must satisfy $|H(j, k)| = 1$, where G(m, n) is the complex amplitude transmission of the unit cell located at the mth row and nth column.

If the portion of the base 11 to be covered by the transparent thin film 12 is selected randomly, the condition of $|H(j, k)| \approx 1$ is believed to be satisfied only on a problematic basis. Generally speaking, the random distribution is considered to be an infinite number; therefore, there is no guarantee that the finite random distribution will satisfy the condition of $|H(j, k)| \approx 1$. In fact, most arbitrary selections of finite random distributions do not satisfy this condition. For selecting an optimum one for $|H(j, k)| \approx 1$ among many selected random distributions is an enormous job.

To help the understanding of the problem, FIGS. 15a and 15b show a simulated analysis for $|H(k)|$ by using a computer for two-phase (0, π) and four-phase (0, π/2, π, 3/2π) random phase shifters, respectively. As can be seen from the two calculated embodiments, $|H(k)|$ shows a considerable strong peak and is not uniformly distributed.

In comparison thereto, the results obtained by using phase shifters according to the present invention are shown in FIGS. 16a and 16b. FIG. 16a corresponds to two-phase, and FIG. 16b corresponds to four-phase. From these results, it is seen that $|H(k)|$ shows considerable uniformity, and, moreover, it is decided deterministically.

We claim:

1. A phase shifter for hologram recording comprising a number of unit cells arranged in a matrix shape and formed by a transparent dielectric film applied on a transparent plate, the improvement comprises that the unit cells are arranged at locations corresponding to a phase distribution satisfying the following conditions:

$G(m, n) = G_M(m)G_N(n)$
$m = 0, 1, 2, \ldots, M-1$ (number of rows)
$n = 0, 1, 2, \ldots, N-1$ (number of columns)

$$G_M(m) = \begin{cases} G_m(a) & (m = a) \\ X_m(m-a) & (m \neq a) \end{cases}$$

$$G_N(n) = \begin{cases} G_N(b) & (n = b) \\ X_N(n-b) & (n \neq b) \end{cases}$$

wherein, $G(m, n)$ is the complex amplitude transmission of a unit cell of mth row and nth column, M, N are 1 or odd prime numbers, but if M or N equal 1, then N or M is greater than 1,
M, N are 1 or odd prime numbers
a is a certain definite integer among $0, 1, 2, \ldots, M-1$,
b is a certain definite integer among $0, 1, 2, \ldots, N-1$,
$\chi_L(P)$ is a primitive character when the modulus is L,
$|G_M(a)| = 1$ or 0
$|G_N(b)| = 1$ or 0
however, if priority is to be decided, 0 has the priority.

2. A phase shifter for hologram recording comprising a number of unit cells arranged in a matrix shape and formed by a transparent dielectric film applied on a transparent plate, the improvement comprises that the unit cells are arranged at locations corresponding to a phase distribution satisfying the following conditions:

$G(m, n) = G_M(m)G_N(n)$
$m = 0, 1, 2, \ldots, M-1$ (number of rows)
$n = 0, 1, 2, \ldots, N-1$ (number of columns)

$$G_M(m) = \begin{cases} G_m(a) & (m = a) \\ X_m(m-a) & (m \neq a) \end{cases}$$

$$G_N(n) = \begin{cases} G_N(b) & (n = b) \\ X_N(n-b) & (n \neq b) \end{cases}$$

wherein, $G(m, n)$ is the complex amplitude transmission of a unit cell of mth row and nth column, M, N are 1 or odd prime numbers, but if M or N equal 1, then N or M is greater than 1,
M, N are 1 or odd prime numbers
a is a certain definite integer among $0, 1, 2, \ldots, M-1$,
b is a certain definite integer among $0, 1, 2, \ldots, N-1$, $$\chi_L(P) = \exp\{i2\pi \frac{S}{L-1} \text{Ind}(P)\},$$

wherein S is a certain definite integer among $1, 2, \ldots, L-2$, and Ind(P) is an index making a primitive root having modulus L as the base,
$|G_M(a)| = 1$ or 0
$|G_N(b)| = 1$ or 0
however, if priority is to be decided, 0 has the priority.

3. A phase shifter comprising:
a transparent plate;
a transparent dielectric film with a number of unit cells arranged in a matrix shape upon said transparent plate; and the thicknesses of said unit cells of a transparent dielectric film are so selected as to satisfy the following relationship:

for unit cell of mth ($m \neq a$) row and nth ($n \neq b$) column, $$d(m, n) = \frac{\lambda}{\epsilon - 1} \frac{\phi(m, n)}{2\pi}$$

$$\phi(m, n) = 2\pi\{\frac{u}{M-1} \text{Ind}(m - a) + \frac{v}{N-1} \text{Ind}(n - b)\} \pmod{2\pi};$$

and unit cell of ath row or bth column is opaque, or for the thicknesses of unit cell of ath row or bth column, $$\begin{rcases} d(a, n) \\ d(m, b) \end{rcases} = \frac{\lambda}{\epsilon - 1} \{\frac{a'}{M-1} + \frac{b'}{N-1}\},$$

however, if priority is to be decided, opaque of unit cell has priority,
wherein
$d(m, n)$ = thicknesses of unit cell of the mth row and nth column,
$\phi(m, n)$ = phase shifting amounts of unit cell of the mth row and nth column,
$\epsilon$ = index of refraction of said film
$\lambda$ = wavelength of incident light
M, N = 1 or odd prime numbers, but if M or N equal 1, then N or M is greater than 1
a, b = a certain definite integer among $0, 1, 2, \ldots, M-1$, and a certain definite integer among $0, 1, 2, \ldots, N-1$, respectively,
u, v = a certain definite integer among $1, 2, \ldots M-2$, and a certain definite integer among $1, 2, \ldots N-2$, respectively,
Ind(p) = index making r as the base, and r is a primitive root having modulus P where, $p = 0, 1, 2, \ldots P-1$,
a', b' = for a given m or n, a certain definite integer among $0, 1, \ldots M-2$ and a certain definite integer among $0, 1, \ldots N-2$, respectively.

* * * * *